United States Patent [19]
Lee

[11] Patent Number: 6,004,653
[45] Date of Patent: Dec. 21, 1999

[54] PLANARIZATION PROCESS BY APPLYING A POLISH-DIFFERENTIATING TECHNIQUE UTILIZING AN ULTRAVIOLET-LIGHT SENSITIVE ORGANIC OXIDE LAYER

[75] Inventor: Chen-tsai Lee, Taipei, Taiwan

[73] Assignee: Winbond Electronics Corp., Hsinchu, Taiwan

[21] Appl. No.: 08/800,556

[22] Filed: Feb. 18, 1997

[51] Int. Cl.[6] .................................................. H01L 21/302
[52] U.S. Cl. ......................... 428/141; 428/901; 428/156; 428/195; 428/543; 428/409; 428/410; 428/913; 216/38; 216/62; 438/705; 438/692; 438/690; 438/691; 438/693; 430/9; 430/11; 430/18
[58] Field of Search ..................................... 428/141, 901, 428/156, 195, 543, 409, 410, 913; 216/38, 62; 438/705, 692, 690, 691, 693; 430/9, 11, 18

[56] References Cited

U.S. PATENT DOCUMENTS

| 5,314,843 | 5/1994 | Yu et al. ............................... 437/225 |
|---|---|---|
| 5,484,687 | 1/1996 | Watanabe et al. ...................... 430/296 |
| 5,527,872 | 6/1996 | Allman ........................................ 528/12 |
| 5,665,202 | 9/1997 | Subramaniun et al. ................ 438/692 |
| 5,743,998 | 4/1998 | Park ...................................... 156/628.1 |
| 5,872,043 | 2/1999 | Chen ........................................ 438/424 |
| 5,872,045 | 2/1999 | Lou et al. ................................ 438/432 |
| 5,880,003 | 3/1999 | Hayashi .................................. 438/405 |

*Primary Examiner*—William P. Watkins, III
*Attorney, Agent, or Firm*—Bo-In Lin

[57] ABSTRACT

This invention discloses a method of planarizing a top surface with variations of profile heights above a substrate of a semiconductor chip. The method includes a step producing a polish-differentiating surface which has polishing rates proportional to the variations of the profile heights of the polish-differentiating surface above the substrate provided for performing a planarization process by applying a polishing process thereon. With the polishing differentiating surface the dishing effects of the semiconductor chip is substantially reduced when a one-time chemical mechanical polishing (CMP) process is applied for semiconductor chip planarization.

7 Claims, 4 Drawing Sheets

PLANARIZATION PROCESS BY APPLYING A POLISH-DIFFERENTIATING TECHNIQUE UTILIZING AN ULTRAVIOLET-LIGHT SENSITIVE ORGANIC OXIDE LAYER

BACKGROUND OF THE INVENTION

1. Field of the Invention

This invention relates generally to the manufacture method for semiconductor chips and integrated circuits (ICs). More particularly, this invention relates to a novel and improved method of manufacture by applying a differentiating polishing technique on the top layer of the semiconductor chip to produce a variation of polishing rates of these layers such that the variations of rates are proportional to the profile heights in different areas for layer removal such that the planarization process can be precisely controlled and effectively carried out with a simplified and cost-effective methodology.

2. Description of the Prior Art

The planarization process for producing a smooth planar surface on the top surface of a semiconductor chip still faces technical difficulties that more complicate processing steps are required to achieve a non-dishing surface profile. The major difficulties arise from the fact that different areas on the top surface usually have different profile heights rising above the substrate. In order to produce a leveled planarized surface, removal of layers near the top surface of different thickness in different areas, depending on the profile, would be required in order to produce a truly planar surface. However, it is often difficult to differentiate and then precisely control the polishing and layer removal processes in different areas to remove the top layers at different rates in order to achieve this planarization purpose. Various techniques are applied to circumvent this difficulties as will be discussed below. However, these techniques are often quite complicated, requiring the applications of more processing steps and thus unduly increasing the time and cost of production in manufacturing the semiconductor chips.

The "dishing effect" resulting from a conventional planarization process can be understood by referring to the cross section views shown in FIGS. 1A to 1C where a semiconductor chip 10 of wide spacing 15 is disposed between two circuit elements 12 and 14 raising above a planar surface. FIG. 1A shows a silicon dioxide layer 20 is formed covering over the top of the circuit elements and the wide spacing 15. Conforming to the profile formed by the circuit elements 12, 14 and the wide spacing 15 between them, the top surface of the oxide layer 20 above the wide spacing 15 parallel substantially to top surface of the substrate 11 steps to a lower level 16. In FIG. 2, a polishing pad layer 25 is then deposited on top of the silicon dioxide layer 20. The polishing pad layer 25 is then polished by the use of a chemical mechanical polishing (CMP) process to generate a planar surface. FIG. 1C shows the polished surface which has a dishing depressions 24 right over the top correspond to the edges where the circuit elements 12 and 14 defining the boundary of the wide spacing 15.

In order to prevent this dishing profile as shown in FIG. 1C, a two-step chemical-mechanical polishing (CMP) process is applied. In this two step CMP process, a polishing stopper layer is deposited on top of the dielectric layer, e.g., layer 20 as shown in FIG. 1B. An example of such polishing stopper is a polyimide layer. In this two-step CMP process, a polishing stopper layer, e.g., a polyimide layer, is deposited on top of the dielectric layer. A photolithography process is performed on the polishing stopper carbon layer. The polishing layer is then etched to form the polishing stopper. A first CMP is performed to remove the portion of the dielectric layer such that a level surface is formed at a same level as that of the polishing stopper. The polishing stopper is then removed and a second CMP process is carried out to planarize the dielectric layer.

While the two step Cow process, as described above, can provide the advantage that a dishing profile on a semiconductor chip is eliminated with depressions on the top surface removed. However, compared to the one-step CMP process illustrated in FIGS. 1A to 1C, this two-step CMP process is more complicate which involves more processing steps thus is more time consuming and also causing the cost of manufacture to increase.

A different technique to prevent the dishing effect on a surface of the semiconductor chip which usually occur in patterned wide spacing between circuit elements, is to form dummy pattern in the wide spacing areas to eliminate the wide spacing, e.g., wide spacing 15 as that shown in FIG. 1A. With the dummy patterns formed on the wide spacing areas, a semiconductor chip can be planarized with a one-step CMP process. However, the circuit RC delay caused by resistor-capacitor (RC) effect is increased when dummy patterns are added in the wide spacing areas. The speed of circuit operation and performance level are often adversely affected with the dummy patterns added for the purpose of chip planarization.

Therefore, a need still exists in the art of semiconductor chip and integrated circuit (IC) manufacture to provide a novel manufacture process to resolve the above difficulties. It is desirable that the novel manufacture process is simple and easy to implement whereby a lower cost of manufacture can be achieved. Additionally, it is desirable that this novel manufacture process provides more control precision for the planarization process such that high quality leveled planar surface of a semiconductor chip can be produced reliably and the quality, reliability, and performance level of integrated circuits forming in the semiconductor chips can be improved.

SUMMARY OF THE PRESENT INVENTION

It is therefore an object of the present invention to provide a novel and improved manufacture process for performing the task of planarizing the top surface of a semiconductor chip by applying a polishing-rate differentiating technique to the top surface of the semiconductor chip such that the difficulties and limitations encountered in the prior art can be overcome.

Specifically, it is an object of the present invention to provide a novel and improved manufacture process for performing the task of planarizing the top surface of a semiconductor chip by applying a polishing-rate differentiating technique by coating an ultraviolet sensitive material on the top surface of the semiconductor chip and by exposing the UV-sensitive layer to different level of exposure to generate different polishing rates whereby the top surface can be planarized without the dishing profile as that produced by the one-step CMP process in the prior art.

Another object of the present invention is to provide a novel and improved manufacture process for performing the task of planarizing the top surface of a semiconductor chip by applying a polishing-rate differentiating technique by coating an ultraviolet sensitive material on the top surface of the semiconductor chip and by exposing the UV-sensitive layer to different level of exposure to generate different polishing rates whereby the top surface can be planarized by applying a simplified one-step CMP process to produce improved planarized top surface.

Another object of the present invention is to provide a novel and improved manufacture process for performing the task of planarizing the top surface of a semiconductor chip by applying a polishing-rate differentiating technique by coating an ultraviolet sensitive material on the top surface of the semiconductor chip and by exposing the UV-sensitive layer to different level of exposure to generate different polishing rates whereby the top surface can be planarized without a dishing profile without requiring the use of dummy patterns commonly employed by the prior art.

Another object of the present invention is to provide a novel and improved manufacture process for performing the task of planarizing the top surface of a semiconductor chip by applying a polishing-rate differentiating technique by coating an ultraviolet sensitive material on the top surface of the semiconductor chip and by exposing the UV-sensitive layer to different level of exposure to generate different polishing rates whereby the top surface can be planarized with higher precision by precisely controlling the ultraviolet exposures at different regions for semiconductor chip which have different profiles.

Briefly, in a preferred embodiment, the present invention discloses a method of planarizing a top surface with variations of profile heights above a substrate of a semiconductor chip. The method includes a step producing a polish-differentiating surface which has polishing rates proportional to the variations of the profile heights of the polish-differentiating surface above the substrate provided for performing a planarization process by applying a polishing process thereon.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1A:
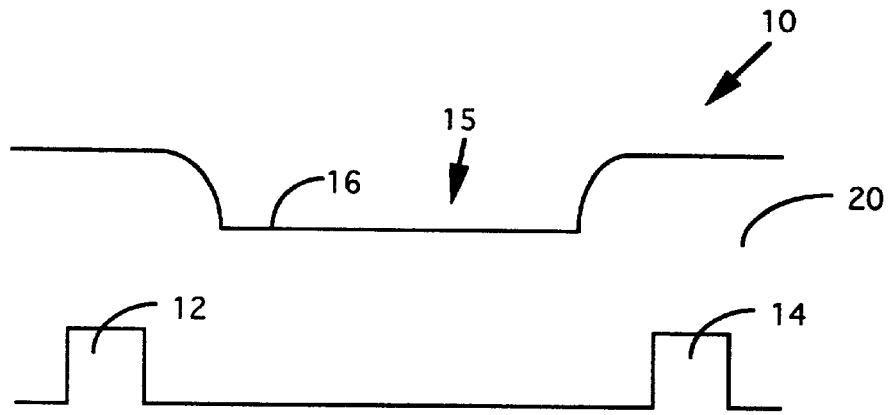
FIG. 1A, FIG. 1B, and FIG. 1C are cross sectional view for illustrating the processing steps implemented in a prior art manufacture method for planarizing the top surface of a semiconductor chip.
Figure 1B:
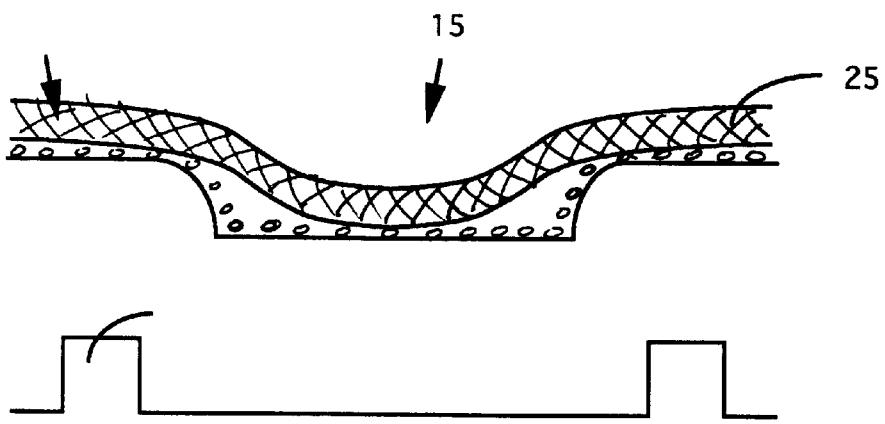
Figure 1C:
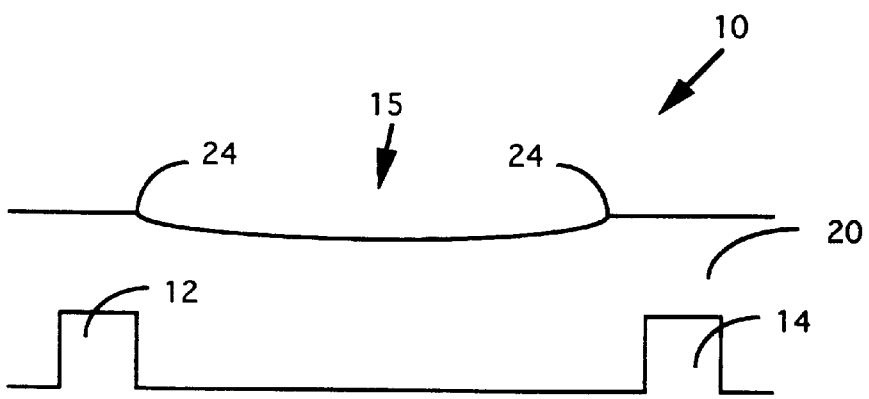
Figure 2A:
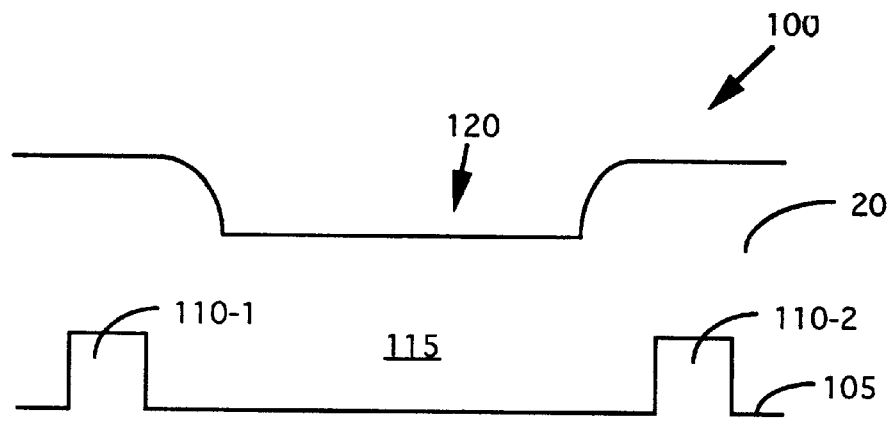
FIGS. 2A, 2B, 2C, 2D, 2E, 2E, 2F, and 2G are a series of cross section view of a semiconductor chip for illustrating the processing steps of a novel planarization technique according to the present invention.
Figure 2B:
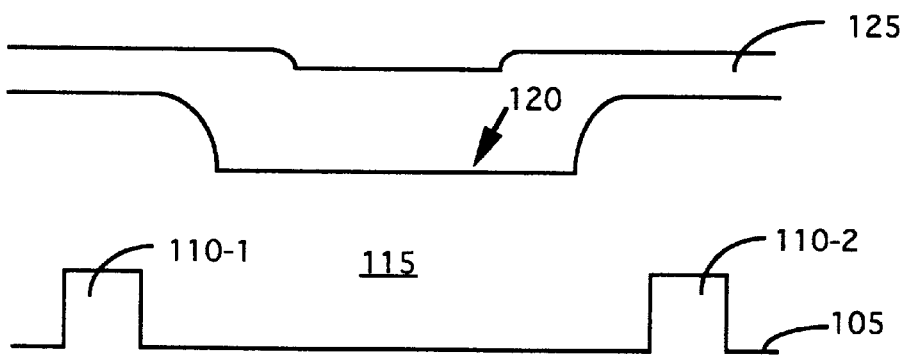

Referring to FIGS. 2A to 2G for a series of cross section views to illustrate the processing steps to improve the planarization of the surface of semiconductor chip according a novel and improved method of the present invention. The semiconductor chip 100 is supported on a patterned substrate 105 where electronic circuit elements 110-1 and 110-2 are formed. A patterning mask is employed for defining a pattern as that shown in FIG. 1A. A dielectric oxide layer 115 is deposited, e.g., by employing a chemical vapor deposition (CVD) process, on top of the patterned substrate 105. As the silicon dioxide layer 115 is substantially a conforming layer, a step-down portion 120 is formed in a wide spacing area between the two electronic circuit elements 110-1 and 110-2. In FIG. 2B, an organic oxide layer coating process is carried out to deposit an organic oxide layer 125 of a thickness ranging from 3000 to 10,000 angstroms depending on the specific IC chip configurations, over the dielectric layer 115. The organic oxide layer composed of ultraviolet (UV) sensitive organic species, e.g., a spin-on-glass (SOG) layer composed of organic oxide of Allied-Signal 214, 314 GR720 (methylphenylpolysiloxane) etc. compounds, to produce a photo-chemical reaction upon exposure to an ultraviolet radiation. As a result of the photo-chemical reaction, the polishing rate of the organic oxide layer 125 will be increased proportional to the UV exposure received. The organic oxide layer also formed a step-down portion 140 in the mid-portion between the electronic circuit elements 110-1 and 110-2.

Figure 2C:
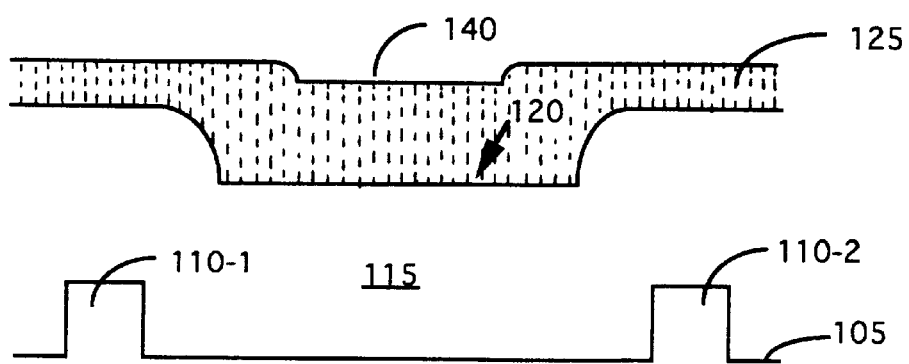

In FIG. 2C, a first ultraviolet exposure is applied, typically at a temperature of 120° C. for one minute, to the organic oxide layer 125 to increase the polishing rate of the organic oxide layer 125 such that the polishing rate of the ultraviolet-exposed organic oxide layer 125 is increased to a rate which is substantially the same as the polishing rate of the dielectric oxide layer 115 underneath. As will be discussed below that the chemical-mechanical polishing (CMP) process is greatly simplified by adjusting the polishing rate of the UV-sensitive organic dioxide layer 125 to be substantially the same as the dielectric layer 115. This advantage is provided from the fact that in a CMP process performed subsequent to a differentiating ultraviolet exposure, i.e., a second ultraviolet exposure, the planarization process by applying the CMP step, the portion of the organic dioxide layer 125 which is not subjected to a differentiating ultraviolet exposure is polished and removed in a same rate as the rate of the dielectric layer 115.

Figure 2D:
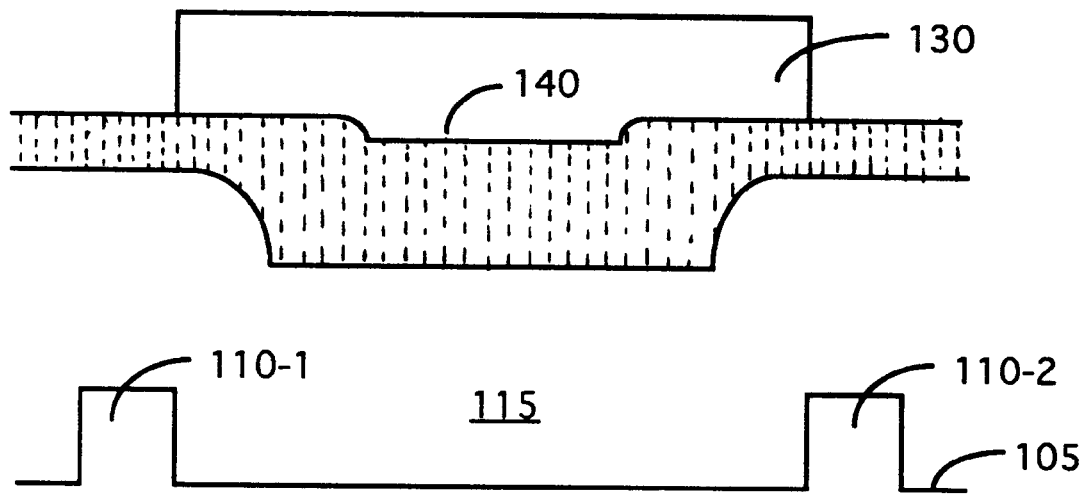

In FIG. 2D, a photo-resist (PR) 130 which is employed as the patterning mask for defining the patterned substrate (FIG. 2A) is applied for reverse-tone patterning in wide-spacing areas where there are spaces between circuit elements having a distance greater than ten microns. The purpose of the reverse-tone patterning is to define the areas to be exposed to a process of applying a second UV exposure. As shown in FIG. 2C, the photo-resist 130 is employed for covering the step-down portion 140 on the top surface of the oxide organic layer 125. A second ultraviolet exposure is applied with the photo-resist (PR) 130 cover the middle step-down portion 140. As that shown in FIG. 2E, the portions of the organic oxide layer 125 which are not covered by the photo-resist 130 are now exposed to additional ultraviolet light Because of the additional ultraviolet-exposures, the polishing rate of these uncovered portions is higher than the step-portion 140 of the organic oxide layer 125. Generally, the second UV exposure applies an ultraviolet light of higher intensity to carry out an exposure with longer duration at a higher temperature than the first exposure. A conventional ultraviolet baking machine made by Fusion Company commonly used for photo-resist hardening process can be employed to carry out the Ultraviolet exposure process. The ultraviolet exposure can be carried out at a temperature ranging from 90° C. to 150° C. for a time duration of one to three minutes.

Figure 2E:
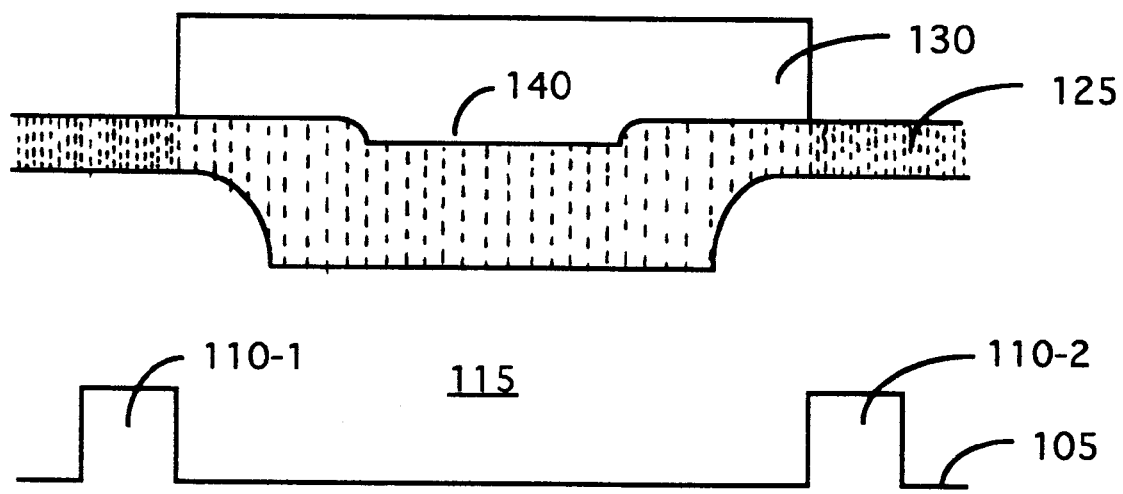

As shown in FIG. 2E, the thickness of the organic oxide layer in the step-down portion 140 above the level of the raised-portions of the dielectric layer 115 is represented by a parameter $h_1$ and the thickness of the organic oxide layer in the uncovered portion above the raised portion of the dielectric layer 115 is represented by a parameter $h_2$. For the purpose of improving the planarization, the total accumulated ultraviolet exposure, i.e., E, in the covered portion 140, i.e., $E_1$ and that in the uncovered portion $E_2$ are predetermined with a specific functional correlation, i.e., a correctional function F, to the thickness as represented by the following equation:

$$(E_1/E_2) = F(h_1/h_2) \quad (1)$$

And, the polishing rate, i.e., R, is increased according to the accumulated ultraviolet exposure received in each portion. In the above process where there are a once exposed region with a polishing rate of $R_1$ and a twice exposed region with polishing rate of $R_2$ wherein, for improving the planarization, the polishing rates $R_1$ and $R_2$ can be represented by:

$$(R_1/R_2) = (h_1/h_2) = F(E_1/E_2) \quad (2)$$

According to Equation (2), the ratio of the height of the organic layer 125 which is removed in the once exposed region with that of the twice exposed region, i.e., $(h_1/h_2)$, is the same as the ratio of the increase of the polishing rates, i.e., $(R_1/R_2)$. Under the condition defined by Equation (2), when the CMP process is performed on the top surface of the organic oxide layer 125, the top surface of the twice exposed region is polished and removed faster than the once exposed region because of different polishing rates resulting from different ultraviolet exposures. Because of the different rates of top surface polishing and removal condition as defined by Equation (2), an improved planarization effect can be achieved.

Figure 2F:
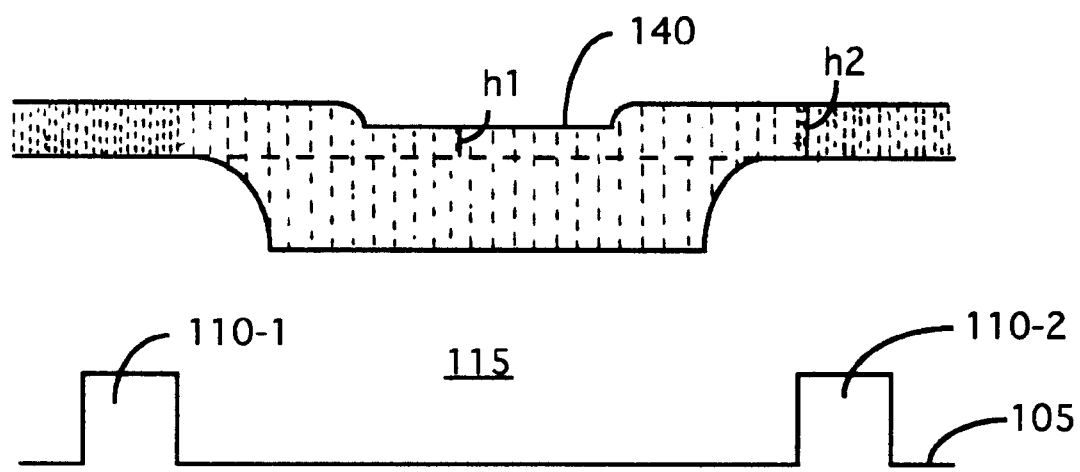
Figure 2G:
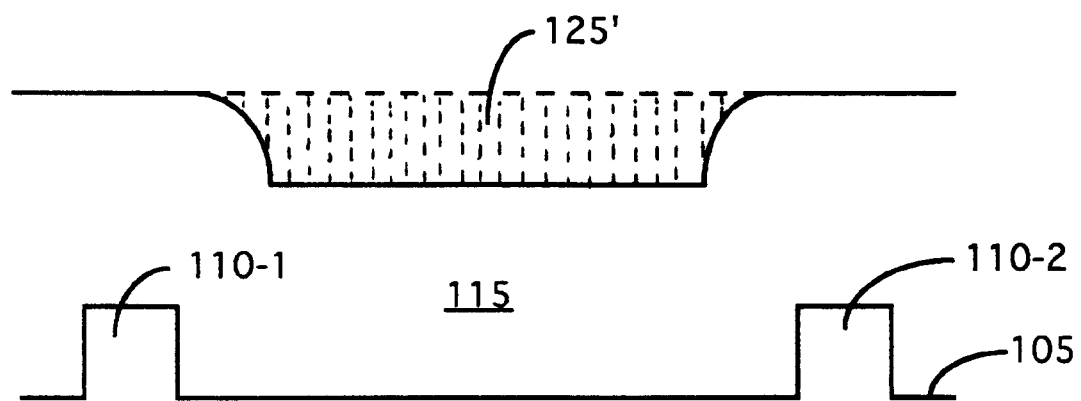

In FIG. 2F, the photo-resist 130 is removed. A chemical mechanical polishing process is performed, by employing a CMP machine such as Nesteck-472, to remove the top portion of the organic oxide layer 125. As the polishing rate for the step-down portion 140 in the organic oxide layer 125 is lower than the portion which is not covered by the photo-resist 130 because of the difference in ultraviolet exposures, the chemical-mechanical polishing process removes the organic oxide at a lower rate in the step-down portion 140. Therefore, a remnant portion of the organic oxide layer 125 remains which is not removed as that shown in FIG. 2G. A planarized surface is therefore formed because of the difference in the polishing rate as result of different ultraviolet exposures in different portions of the organic oxide layer 125. In semiconductor chips where it is required to remove the remained organic oxide portion 125', a post-planarization CMP process maybe performed to remove the top portion including the remained organic oxide portion 125' and the top portion of the silicon dioxide layer 115. Because the polishing rate of the remained portion 125' of the organic oxide layer is the same as the dielectric layer 115, the CMP process can be simplified without requiring to distinguish between the organic oxide portion and the dielectric portion. FIG. 2G shows the final result after the post-planarization CMP process is completed. The dishing effect is eliminated by applying this novel planarization technique by applying differentiating ultraviolet exposure on the top surface of an ultraviolet sensitive organic oxide layer 125.

In summary, this invention discloses a method of planarizing a top surface with variations of profile heights above a substrate 105 of a semiconductor chip 100. The method includes a step producing a polish-differentiating surface 125 which has polishing rates proportional to the variations of the profile heights of the polish-differentiating surface above the substrate 105, i.e., $(R_1/R_2) = (h_1/h_2)$ as that shown in FIG. 2E, provided for performing a planarization process by applying a polishing process thereon.

Furthermore, the present invention discloses a semiconductor chip 100 formed on a substrate 105 having a top surface with variations of profile heights above the substrate 105. The semiconductor chip 100 includes a polish-differentiating surface 125 disposed on the top surface of the semiconductor chip 100 with polishing rates proportional to the variations of profile heights, e.g., h1 and h2, of the polish-differentiating surface 125 above the substrate 105 provided for performing a planarization process by applying a polishing process thereon. In a preferred embodiment, the polish-differentiating surface 125 including a photo sensitive layer disposed on the top surface above the substrate 105 wherein the photo sensitive layer being exposed to photo exposures thus constituting the polishing-differentiating surface. In another preferred embodiment, the photo sensitive layer 125 disposed on the top surface above the substrate including an ultraviolet sensitive layer which being exposed to ultraviolet exposures thus constituting the polishing-differentiating surface. In a specific preferred embodiment, the ultraviolet sensitive layer 125 including an ultraviolet-sensitive organic oxide layer. In yet another preferred embodiment, the ultraviolet sensitive layer 125 including a once ultraviolet-exposed layer and a twice ultraviolet-exposed layer thus constituting the polishing-differentiating surface with two different polishing rates, as that shown in FIG. 2F, for planarization.

A novel and improved manufacture process for performing the task of planarizing the top surface of a semiconductor chip by applying a polishing-rate differentiating technique to the top surface of the semiconductor chip such is provided in this invention. By applying the method of this invention, the difficulties and limitations encountered in the prior art can be overcome. Specifically a novel and improved manufacture process for performing the task of planarizing the top surface of a semiconductor chip is taught by this invention which applies a polishing-rate differentiating technique by coating an ultraviolet sensitive material on the top surface of the semiconductor chip and by exposing the UV-sensitive layer to different level of exposure to generate different polishing rates whereby the top surface can be planarized without the dishing profile as that produced by the one-step CMP process in the prior art. By coating an ultraviolet sensitive material on the top surface of the semiconductor chip and by exposing the UV-sensitive layer to different level of exposure to generate different polishing rates as disclosed by this invention, a simple method is provided such that the top surface can be planarized by applying this simplified one-step CMP process to produce improved planarized top surface. Furthermore, the dishing profile is eliminated without requiring the use of dummy patterns or a two-step CMP process which are commonly employed by the prior art. Additionally, by applying a polishing-rate differentiating technique as disclosed by this invention, the top surface can be planarized with higher precision by precisely controlling the ultraviolet exposures at different regions for a semiconductor chip which have different profiles heights. Integrated circuits of higher quality which are more reliable and produce better performance can therefore be achievable with an improved semiconductor chip.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A semiconductor chip formed on a substrate having a top surface with variations of profile heights above said substrate comprising:

a polish-differentiating layer disposed on said top surface of said semiconductor chip having a photo exposure profile substantially proportional to said variations of profile heights over said top surface for generating a polishing rate profile over said polishing-differentiating layer proportional to said variations of profile heights above said substrate provided for performing a planarization process by applying a polishing process thereon.

2. The semiconductor chip of claim 1 wherein:

said polish-differentiating layer including a photo sensitive layer having a thickness ranging from 3000 to 10,000 Angstroms.

3. The semiconductor chip of claim 2 wherein:

said photo sensitive layer disposed on said top surface above said substrate including an ultraviolet sensitive layer having an ultraviolet exposure profile substantially proportional to said variations of profile heights over said top surface.

4. The semiconductor chip of claim 3 wherein:

said ultraviolet sensitive layer including an ultraviolet-sensitive organic oxide layer.

5. The semiconductor chip of claim 4 wherein:

said ultraviolet sensitive layer including a once ultraviolet-exposed layer and a twice ultraviolet-exposed layer for providing said polishing-differentiating surface with two different polishing rates substantially proportional to said ultraviolet exposure profile.

6. A semiconductor chip formed on a substrate having a top surface with variations of profile heights above said substrate comprising:

an ultraviolet-sensitive organic oxide layer disposed on said top surface of said semiconductor chip having an ultraviolet exposure profile substantially proportional to said variations of profile heights over said top surface for providing a polish-differentiating layer with polishing rates substantially proportional to said ultraviolet exposure profile over said ultraviolet-sensitive organic oxide layer above said substrate provided for performing a planarization process by applying a polishing process thereon.

7. The semiconductor chip of claim 6 wherein:

said ultraviolet sensitive organic oxide layer including a once ultraviolet-exposed layer and a twice ultraviolet-exposed layer thus providing said polishing-differentiating layer with two different polishing rates for planarization.

* * * * *